United States Patent
Kahlman

(10) Patent No.: US 6,710,724 B2
(45) Date of Patent: Mar. 23, 2004

(54) DEVICE FOR ENCODING/DECODING N-BIT SOURCE WORDS INTO CORRESPONDING M-BIT CHANNEL WORDS, AND VICE VERSA

(75) Inventor: Josephus Arnoldus Henricus Maria Kahlman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/833,412

(22) Filed: Apr. 12, 2001

(65) Prior Publication Data

US 2001/0050623 A1 Dec. 13, 2001

(30) Foreign Application Priority Data

Apr. 25, 2000 (EP) .............................................. 00201479

(51) Int. Cl.[7] ................................................ H03M 7/00
(52) U.S. Cl. ............................... 341/50; 341/95; 341/59
(58) Field of Search ............................... 341/59, 50, 58, 341/63, 95, 68, 67, 69; 360/29, 48

(56) References Cited

U.S. PATENT DOCUMENTS

| | | | | |
|---|---|---|---|---|
| 4,337,458 A | * | 6/1982 | Cohn et al. | 341/63 |
| 4,547,890 A | * | 10/1985 | Gindi | 341/59 |
| 5,151,639 A | * | 9/1992 | Hasegawa et al. | 318/568.18 |
| 5,477,222 A | | 12/1995 | Kahlman et al. | 341/95 |
| 5,552,940 A | * | 9/1996 | Umemoto et al. | 341/59 |
| 5,585,976 A | * | 12/1996 | Pham | 360/77.04 |
| 5,861,825 A | * | 1/1999 | Ino | 341/50 |
| 6,175,318 B1 | * | 1/2001 | Kahlman et al. | 341/59 |
| 6,243,226 B1 | * | 6/2001 | Jeong | 360/78.07 |

FOREIGN PATENT DOCUMENTS

WO 9933183 7/1999 ............ H03M/5/14

OTHER PUBLICATIONS

Coding Techniques for Digital Recorders; Kees A. Schouhamer Immink; 1991; pp. 68–153.
Spectrum of a Binary Signal Block Coded for DC suppression; L.J. Greenstein; Jan. 8, 1974 pp. 1103–1107.

* cited by examiner

Primary Examiner—Jean Jeanglaude
(74) Attorney, Agent, or Firm—John Vodopia

(57) ABSTRACT

A device is provided for encoding a stream of data bits of a binary source signal (S) into a stream of data bits of a binary channel signal ($C_1$), wherein the bit stream of the source signal is divided into n-bit source words ($x_1$, $X_2$). The device includes converting means adapted to convert the source words into corresponding m-bit channel words ($y_1$, $y_2$, $y_3$). Each n-bit source word together with another n-bit source word forms a pair of source words. The values of the n-bit source words differ only in the value of the bit in the $q^{th}$ bit position, q being a constant. The pairs of source words are divided into a first part of pairs and a remaining part of pairs. The converting means are further adapted to convert n-bit source words belonging to the first part of pairs into corresponding m-bit channel words, in such a manner that the conversion for each of the n-bit source words is parity preserving, and to convert n-bit source words belonging to the remaining part of pairs into corresponding m-bit channel words, in such a manner that the conversion for each of the n-bit source words is parity inverting. A decoding device is also provided for decoding the channel signal obtained by means of the encoding device.

19 Claims, 3 Drawing Sheets

US 6,710,724 B2

Figure 1:
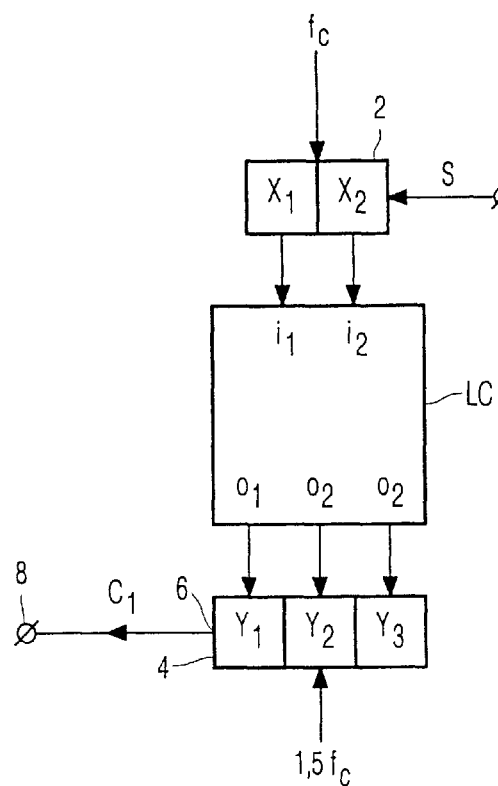

DEVICE FOR ENCODING/DECODING N-BIT SOURCE WORDS INTO CORRESPONDING M-BIT CHANNEL WORDS, AND VICE VERSA

PRIORITY

This application claims priority under 35 U.S.C. §119 to a European patent application filed on Apr. 25, 2000 and assigned European Application No. 00201479.3, the contents of which are incorporated herein by reference.

BACKGROUND OF THE INVENTION

Field of the Invention

The invention relates to a device and to a method for encoding a stream of data bits of binary source signal into a stream of data bits of a binary channel signal, wherein the bit stream of the source signal is divided into n-bit source words, which device includes converting means adapted to convert the source words into corresponding m-bit channel words.

An encoding device mentioned in the foregoing is known from the book 'Coding techniques for digital recorders' by K. A. Schouhamer Immink, chapter 5,6,7, pp. 127 to 131, Prentice Hall (1991). The book discusses an encoder for generating a (d,k) sequence which satisfies the parameters: rate 2/3, (1,7), which encoder is also proposed by Cohn et al in U.S. Pat. No. 4,337,458. The known encoding scheme suffers from the presence of a DC level which may become excessively large and therefore introduces distortion in communication systems which cannot handle a DC component, as well as distortion in any recording of data in magnetic media.

SUMMARY OF THE INVENTION

The invention has for its object to provide a device for encoding n-bit source words into corresponding m-bit channel words in, such a manner that the device itself does not generate a DC component in the channel signal, whereas further it provides the possibility, by means of additional measures to be taken, also provides a possibility of realizing a channel signal in the form of a (d,k) sequence.

The device in accordance with the invention is characterized in that each value of the n-bit source words together with another value of the n-bit source words forms a pair of source words, the values of the source words of said pair of n-bit source words differ in the bit value of the $q^{th}$ bits in the n-bit source words, q being a constant, the pairs of n-bit source words being subdivided into a first part and a remaining part, and the converting means are adapted to convert n-bit source words into m-bit channel words, in such a manner that the conversion of the two source words forming a pair of source words of the first part of the pairs of n-bit source words is parity preserving and the conversion of the two source words forming a pair of source words of the remaining part of the pairs of n-bit source words is parity inverting.

'Parity preserving' means that the parity of the n-bit source words to be converted is the same as the parity (after modulo-2 addition) of the corresponding m-bit channel words into which they are converted. 'Parity inverting' means that the parity of the n-bit source words to be converted is the inverse of the parity (after modulo-2 addition) of the corresponding m-bit channel words into which they are converted. As a result, a unique relationship between the parity of the two source words of a pair and the parity of the corresponding channel words can be obtained, enabling an efficient DC control for the binary channel signal, after aT precoding.

The encoding device in accordance with the invention can be used in combination with a bit-adder unit in which one bit is added to code words of a certain length. The signal obtained can be applied to the encoding device of the present invention. The channel signal of the encoding device is applied to a 1T-precoder. The purpose of the bit-adder unit is to add a '0' bit or a '1' bit to blocks of data in the input signal of the converter, so as to obtain a precoder output signal which is DC free or which includes a tracking pilot signal having a certain frequency. The precoder output signal is recorded on a record carrier. The addition of the one bit to the code words of a certain length is such that this bit will be on the $q^{th}$ bit position of the n-bit source words to be supplied to the converter. In this way two different n-bit source words may be obtained. The n-bit source words thus obtained differ only in the value of the bit in the $q^{th}$ bit position. These two n-bit source words form the pair of n-bit source words. In the case that the conversion of said pair of source words is parity preserving, the addition of a '0' bit to the input signal of the converter results in the polarity remaining the same in the output signal of the 1T precoder and the addition of a '1' bit results in a polarity inversion in the output signal of the 1T precoder. In the case that the conversion of said pair of source words is parity inverting, the addition of a '0' bit in the input signal of the converter results in polarity inversion in the output signal of the 1T precoder and the addition of a '1' bit results in the polarity of the output signal of the 1T precoder remaining the same. The converter therefore influences the output signal of the 1T precoder in such a manner that the running digital sum value of the output signal of the 1T precoder can be controlled so as to have a desired pattern as a function of time.

Preferably, the device in accordance to the invention is characterized in that the converting means are adapted to convert a block of p consecutive n-bit source words into a corresponding block of p consecutive m-bit channel words, where n, m and p are integers, $m > n \geq 2$, $p \geq 1$, and where p may vary.

Preferably, m equals n+1, and n is equal to 2. When n is 2, the device in accordance with the invention, in conjunction with additional measures to be taken, as will become apparent later, can be used ng channel signals in the form of a (d,k) sequence, where d=1. Higher values for n do not allow the generation of a (1,k) sequence. Further, n=2, which means that 2-bit source words are converted into 3-bit channel words, results in a 50% increase in bits in the channel signal generated by the device.

Various conversions of 2-bit source words into 3-bit channel words are possible in which pairs of n-bit source words are parity preserving or parity inverting. It should, however, be noted that various permutations of the channel codes in the Table are possible, namely 8 in total.

The device in accordance with the invention wherein the converting means are adapted to convert 2-bit source words into corresponding 3-bit channel words, so as to obtain a channel signal in the form of a (d,k) sequence, where d=1, the device further comprising means for detecting the position in the bit stream of the source signal where encoding of single 2-bit source words into corresponding single channel words would lead to a violation of the d-constraint at the channel word boundaries and for supplying a control signal in response to said detection, may be further characterized in that, in the absence of the control signal, the converting means are adapted to convert single 2-bit source words into corresponding single 3-bit channel words.

More specifically, the device is characterized in that, in the presence of said control signal, the converting means are further adapted to convert the block of said two subsequent 2-bit source words into a corresponding block of two subsequent 3-bit channel words.

The measure to convert one (say: the second one) of two subsequent source words into a 3-bit word not identical to the four channel words $CW_1$ to $CW_4$, offers the possibility of detecting at the receiver side that a situation existed in which encoding of single source words into corresponding single channel words would have led to a violation of the d=1 constraint. The encoder now encodes a block of two 2-bit source words into a block of two 3-bit channel words. Each value of the block of two 2-bit source words together with another value of the block forms a pair of two 2-bit source words, where the values of said pair of two 2-bit source words differ in the bit value of the $q^{th}$ bit in one of the two 2-bits source words. In this way, the converter influences the output of the 1T precoder in such a manner that the running digital value of the output signal of the 1T precoder can be controlled so as to have a desired pattern as a function of time, while the d=1 constraint is satisfied as well.

To encode blocks of two 2-bit source words, the device in accordance with the invention may be characterized in that the converting means are adapted to convert the blocks of two consecutive 2-bit source words into the blocks of two consecutive 3-bit channel words in accordance with the coding given in the following Table:

| block of 2 source words | block of 2 channel words |
|---|---|
| 00 00 | 100 010 |
| 00 01 | 101 010 |
| 11 00 | 000 010 |
| 11 01 | 001 010 |

The device in accordance with the invention, for generating a (d,k) sequence, wherein k has a value larger than 5, the device being further having means for detecting the position in the bit stream of the source signal where encoding of single 2-bit source words into single 3-bit channel words would lead to a violation of the k-constraint and for supplying a second control signal in response to said detection, may be further characterized in that, in the presence of the second control signal, which occurs during the conversion of three consecutive 2-bit source words, the converting means are adapted to convert a block of said three consecutive 2-bit source words into a block of three corresponding consecutive 3-bit channel words, the converting means are further adapted to convert two of the three source words in the block into corresponding 3-bit channel words not identical to the four channel words $CW_1$ to $CW_4$, in order to preserve the k constraint.

This measure enables an encoding of a block of three 2-bit source words into a block of three 3-bit channel words so as to satisfy the k-constraint, and in such a manner that the encoding is still so as to allow the running digital sum value of the 1T precoder to be controlled so as to have a desired pattern as a function of time.

The measure to convert two (say: the second and the third one) of three subsequent source words into a 3-bit word not identical to the four channel words $CW_1$ to $CW_4$, offers the possibility of detecting at the receiver end that a situation existed in which encoding of single 2-bit source words into corresponding single 3-bit channel words would have led to a violation of the k constraint. Upon detection, the decoder is capable of decoding the block of three 3-bit channel words into the corresponding block of three 2-bit source words a way inverse to that during encoding.

To encode blocks of three 2-bit source words, the device in accordance with the invention may be characterized in that the converting means are adapted to convert blocks of three consecutive 2-bit source words into blocks of three consecutive 3-bit channel words in accordance with the coding given in the following Table:

| block of 3 source words | block of 3 channel words |
|---|---|
| 10 10 10 | 000 010 010 |
| 10 10 11 | 001 010 010 |
| 01 10 11 | 101 010 010 |
| 01 10 10 | 100 010 010 |

A device for decoding a stream of data bits of a binary channel signal into a stream of data bits of a binary source signal, wherein the bit stream of the channel signal is divided into m-bit channel words, which device comprises deconverting means adapted to deconvert m-bit channel words into corresponding n-bit source words, is characterized in that each value of the n-bit source words together with another value of the n-bit source words forms a pair of source words, the values of the source words of said pair of n-bit source words differ in the bit value of a $q^{th}$ bits in the n-bit source words, q being a constant, the pairs of n-bit source words being subdivided into a first part and a remaining part, and the deconverting means are adapted to deconvert m-bit channel words into n-bit source words, in such a manner that the deconversion of the m-bit channel words into the source words that form a pair of source words of the first part of the pairs of n-bit source words is parity preserving and the deconversion of the m-bit channel words into the source words that form a pair of source words of the remaining part of the pairs of n-bit source words is parity inverting.

It should be noted that U.S. Pat. No. 4,547,890 discloses a converter for converting n-bit source words into m-bit channel words, which channel signal is DC free. The converter, however, does not in all situations convert n-bit source words into m-bit channel words, in such a manner that the conversion of the two source words forming a pair of source words of the first part of the pairs of n-bit source words is parity preserving and the conversion of the two source words forming a pair of source words of the remaining part of the pairs of n-bit source words is parity inverting. Furthermore, an algorithm is necessary to select an m-bit channel word so as to produce a DC free output.

DETAILED DESCRIPTION OF THE DRAWINGS

Figure 2A:
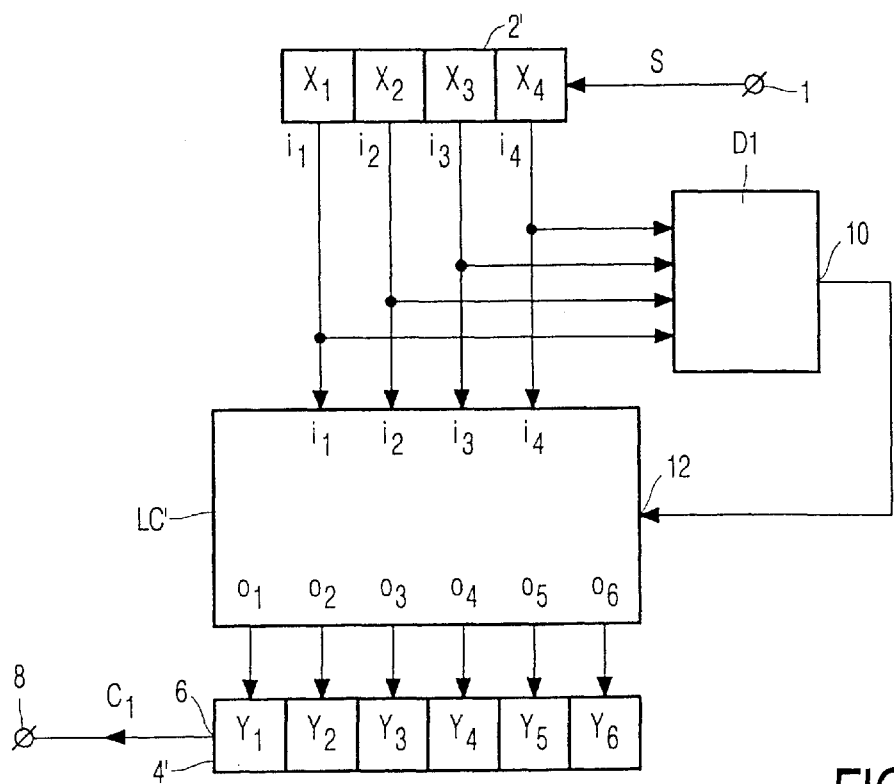
Figure 2B:
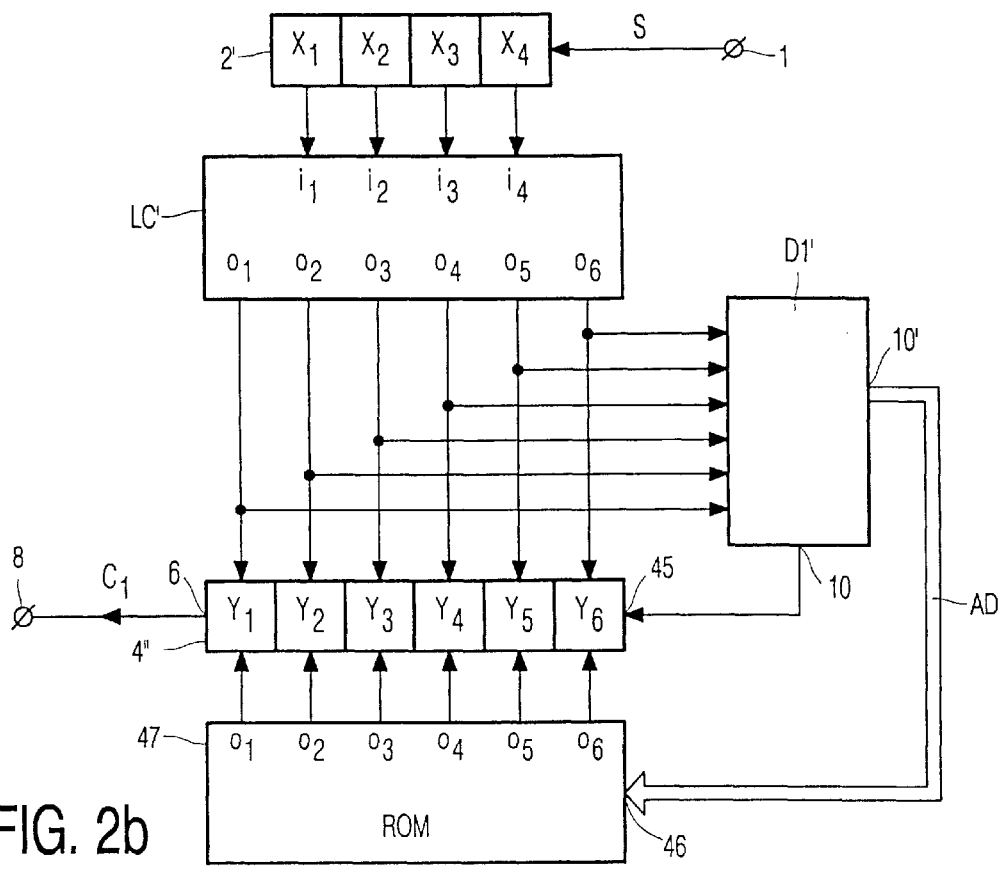
Figure 3:
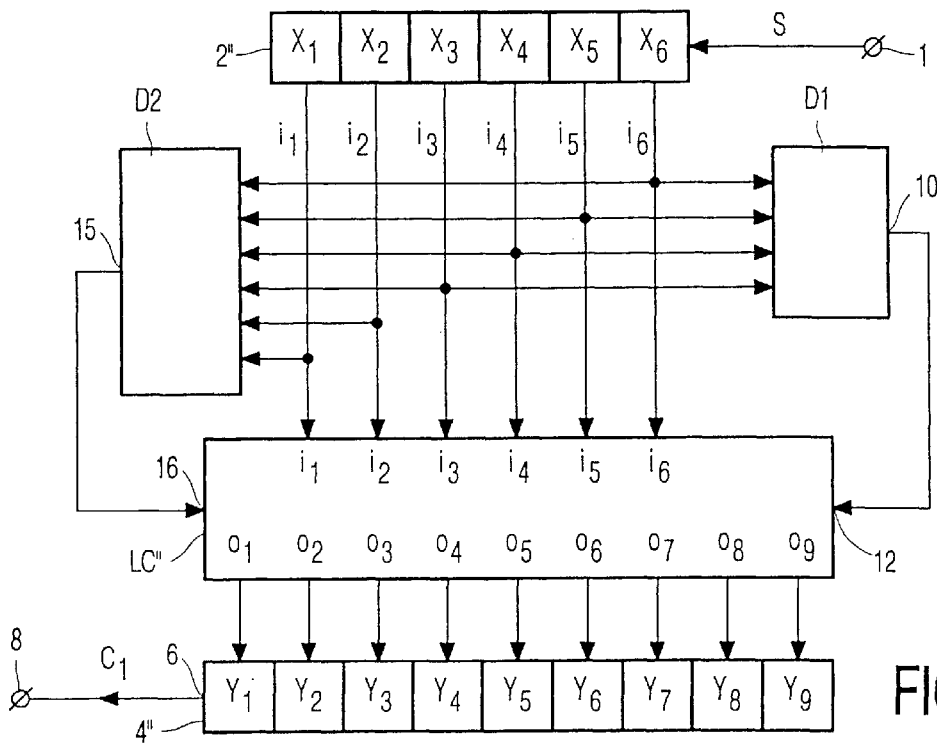
Figure 4:
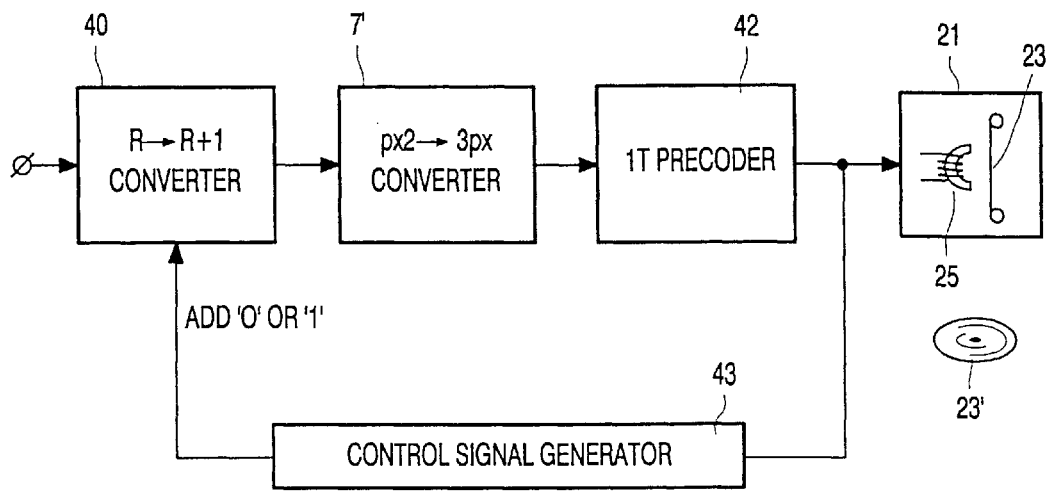
Figure 5:
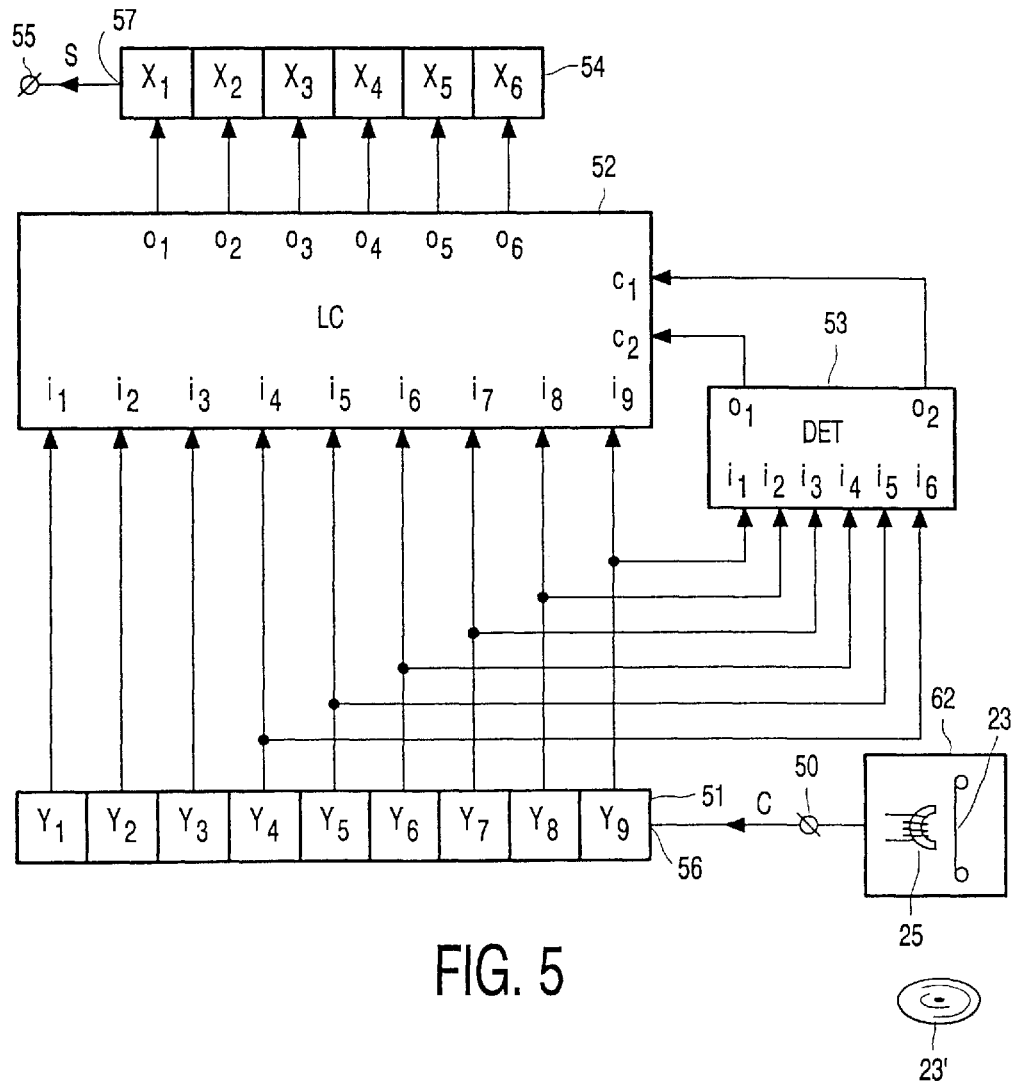

Embodiments of the invention will now be described in more detail, by way of example, with reference to the drawings, in which FIG. 1 shows a first embodiment of the device, FIG. 2a shows a second embodiment of the device, FIG. 2b a third embodiment of the devcie, and FIG. 3 shows a fourth embodiment of the device, FIG. 4 shows the application of the device in an arrangement for inserting one bit at equidistant positions in the serial source signal, and FIG. 5 shows an embodiment of the decoding device.

DETAILED DESCRIPTION OF THE PREFERRED EMBODIMENTS

FIG. 1 shows a device having an input terminal 1, for receiving a stream of data bits of a binary source signal S.

The terminal 1 is coupled to an input of a shift register 2 having two cells $X_1$ and $X_2$ so as to receive two consecutive source bits of the source signal S. The shift register 2 functions as a serial-parallel converter so as to obtain consecutive 2-bit source words SW. The outputs of the two cells are coupled to two inputs $i_1$, $i_2$ of a logic circuit LC, for supplying the logic values $(x_1,x_2)$ of the source bits present in the cells to the logic circuit LC.

The device further includes a second shift register 4 having three cells $Y_1$, $Y_2$ and $Y_3$. Outputs $o_1$, $o_2$ and $o_3$ of the logic circuit LC are coupled to inputs of the three cells $Y_1$, $Y_2$ and $Y_3$, respectively, of the shift register 4, for supplying the logic values $y_1,y_2$, $y_3$) of the channel words. An output 6 of the shift register 4 is coupled to an output terminal 8. The shift register 4 functions as a parallel-serial converter so as to convert the 3-bit channel words CW supplied by the logic circuit LC into a serial stream of data bits of a binary channel signal C.

The logic circuit LC is adapted to convert consecutive 2-bit source words SW into 3-bit channel words. Each of the 2-bit source words SW together with another one of the 2-bit source words forms a pair of source words. The two 2-bit source words have been chosen in such a manner that their values differ only in the bit value at the $q^{th}$ bit position. Thus, in the case that the $q^{th}$ bit position is the last bit position, the values 00 and 01 form a first pair and the values 10 and 11 form the remaining pair. The conversion of the 2-bit source words has been chosen in such a manner that the conversion for the first pair of 2-bit source word is parity preserving and the conversion of the remaining pair is parity inverting. Parity inverting means that the number of 'ones' in the source word to be converted is the inverse of the number of 'ones' in the corresponding channel word, if necessary, after a modulo-2 addition has been performed on the 'ones' in the channel word. In other words: if the number of 'ones' in the source word is even, the number of 'ones' in the channel word will be odd, and, conversely, if the number of 'ones' in the source word is odd, the number of 'ones' in the channel word will be even.

As an example, the converting means LC is adapted to convert the 2-bit source words SW into 3-bit channel words CW in accordance with the following Table:

TABLE I

| source word $(x_1,x_2)$ | | channel word $(y_1,y_2,y_3)$ | |
|---|---|---|---|
| $SW_1$ | 00 | $CW_1$ | 101 |
| $SW_2$ | 01 | $CW_2$ | 100 |
| $SW_3$ | 10 | $CW_3$ | 000 |
| $SW_4$ | 11 | $CW_4$ | 001 |

The pairs of 2-bit source words are formed by the source words that differ in the second bit position $(x_2)$.

It should be noted here, that the first bit in the source word is applied first to the shift register 2 and that the first bit in the channel word is supplied first from the output 6 of the shift register 4.

The bit stream of the channel words is in NRZI (non-return to zero-inverse) notation, which means that a 'one' results in a transition in the write current for recording the channel signal on a magnetic record carrier.

The device of FIG. 1 can be used to generate a channel signal C in the form of a (d,k) sequence satisfying the d=1 constraint. This means that at least one 'zero' is present between two subsequent 'ones' in the serial data stream of the channel signal. That is to say, a concatenation of two or more 'ones' in the channel signal is prohibited.

It may occur that the unmodified conversion, such as by means of the device of FIG. 1, of combinations of two subsequent 2-bit source words would violate the d=1 constraint. Those combinations are the combinations; '00 00', which by unmodified conversion would lead to the two 3-bit channel words '101 101'; '00 01', which by unmodified conversion would lead to the two 3-bit channel words '101 100'; '11 00', which by unmodified conversion would lead to the two 3-bit channel words '001 101' and '11 01', which by unmodified conversion would lead to the two 3-bit channel words '001 100'.

The occurrence of such combinations should be detected so as to enable a modified encoding of blocks of two 2-bit source words into blocks of two 3-bit channel words. FIG. 2a shows a modified embodiment of a device of FIG. 1 which, in addition to the 'normal' encoding of 2-bit source words into 3-bit channel words, is capable of detecting the above identified combinations, and is capable of realizing a modified encoding, in such a manner that the d=1 constraint in the channel signal is still satisfied.

The device of FIG. 2a includes a shift register having four cells $X_1$ to $X_4$ so as to receive four consecutive bits $(x_1,x_2,x_3,x_4)$ of the serial bit stream of the source signal S. Outputs of the four cells are coupled to corresponding inputs $i_1$ to $i_4$ respectively of the logic circuit LC'. The device further comprises a detector unit D1. The detector unit D1 is adapted to detect the position in the serial bit stream of the source signal where unmodified encoding of single source words in the bit stream into corresponding single channel words would lead to a violation of the d=1 constraint in the channel signal C, and is adapted to supply a control signal at its output 10 in response to such detection.

The output 10 of the detector unit D1 is coupled to a control signal input 12 of the logic circuit LC'. The logic circuit LC' has six outputs $o_1$ to $o_6$, which are coupled to inputs of cells $Y_1$, to $Y_6$, respectively, of second shift register 4'.

In the absence of a control signal at the control signal input 12, the logic circuit LC' converts the first 2-bit source word '$x_1$ $x_2$' into the three bit channel word '$y_1$ $y_2$ $Y_3$' in conformity with Table I given above. As soon as the detector circuit D1 detects a combination of two 2-bit source words $(x_1x_2,x_3,x_4)$ which is equal to one of the combinations given above, the logic circuit LC' converts the combination in accordance with the modified coding as given in the following Table:

TABLE II

| Source words | Unmodified coding | modified coding |
|---|---|---|
| 00 00 | 101 101 | 100 010 |
| 00 01 | 101 100 | 101 010 |
| 11 00 | 001 101 | 000 010 |
| 11 01 | 001 100 | 001 010 |

As can be seen from the Table, unmodified conversion of the single two 2-bit source words leads to a violation of the d=1 constraint, because two 'ones' occur at the boundary between the two channel words obtained. The logic circuit LC' is therefore adapted to convert, in a modified coding mode, the blocks of two 2-bit source words given in the left column of the above Table into the blocks of two 3-bit channel words as given in the right column in the above Table II. As can be seen, no violation of the d=1 constraint occurs anymore. Moreover, the modified encoding is again parity preserving or parity inverting but now in pairs of two 2-bit source words. This is very useful in order to be able to obtain a DC free precoder output signal by adding one bit to the input signal so as to obtain the bit stream of the source signal to be supplied to the encoding device. This means in the present situation that, if the number of 'ones' in the blocks of two 2-bit source words forming a pair is odd (even), the number of 'ones' in the block of two 3-bit channel words obtained is odd (even), or the inverted situation is obtained, depending on whether the conversion of a pair of the block of 2-bit source words is parity preserving or parity inverting. Furthermore, one of the two 2-bit source words, which is the second one in the above Table, is encoded into a 3-bit channel word which is unequal to one of the four channel words of Table I. The reason for this is that, at the receiver end, a detection of this 3-bit channel word not belonging to the set of four 3-bit channel words of the Table I is possible, so that a corresponding decoding, which is the inverse of the encoding as defined with reference to Table II, can be realized.

The block of two 3-bit channel words obtained by means of the encoding in conformity with Table II, is supplied by the logic circuit LC' to its outputs $o_1$ to $o_6$, which channel words are supplied to the six cells $Y_1$, to $Y_6$ of the shift register 4'. From the description of the present embodiment it will be evident that the situations where a modified encoding is needed are detected by means of the detector D1 using the source words.

A different construction of the device for carrying out the modified encoding described with reference to the Table II is shown in FIG. 2b. In this case, detection of the situations where a modified coding should be carried out is decided using the converted channel words. The device of FIG. 2b includes a detector D1' having 6 inputs for receiving two subsequent 3-bit channel words obtained by means of the unmodified encoding. The detector D1' detects whether the two subsequent 3-bit channel words obtained using the unmodified coding are equal to one of the four 6-bit sequences given in the middle column under 'unmodified coding' of Table II. If so, the detector D1' issues a switching signal at its output 10 and an address signal AD at its output 10'. The switching signal is applied to a switching signal input 45 of the shift register 4". The address signal AD is applied to an address signal input 46 of a ROM 47. The detector D1' generates one of four possible address signals AD1 to AD4, in response to the detection of a corresponding one of the four 6-bit sequences in the middle column of Table II. As an example, the address signal AD1 is generated when the detector D1' detects the sequence '101 101' and generates the address signal AD4 upon detection of the 6-bit sequence '001 100'. The ROM 47 stores the 6-bit sequences shown in the right column of Table II. Upon receipt of the address signal AD1 the ROM supplies the 6-bit sequence '100 010' at its outputs $o_1$ to $o_6$, and upon receipt of the address signal AD2 the ROM supplies the 6-bit sequence '101 010' at its outputs. Upon receipt of the address signal AD3, the ROM supplies the 6-bit sequence '000 010' at its outputs, and upon receipt of the address signal AD4 the ROM supplies the 6-bit sequence '001 010' at its outputs. Each memory location of the shift register 4" now has two inputs, one of them being coupled to a corresponding output of the logic circuit LC', the other being coupled to a corresponding output of the ROM 47.

In the normal situation, when the d=1 constraint is not violated, unmodified conversion is carried out, and the switching signal is absent, so that the shift register accepts the bits supplied by the logic circuit LC' via the upper inputs of the shift register 4". If the d=1 constraint is violated, the switching signal applied to the switching signal input 45 results in the shift register accepting the 6-bit sequence, which is the modified sequence, applied to the lower inputs of the shift register 4" by the ROM.

The k-constraint in a (d,k) sequence means that a concatenation of at most k 'zeros' is allowed between two subsequent 'ones' in the channel signal.

It may occur that the unmodified conversion of three subsequent 2-bit source words would violate the k-constraint.

As an example: by unmodified conversion the sequence of source words '10 10 10' would yield the three 3-bit channel words '000 000 000'. If a (d,k) sequence should be obtained where k is 6, 7 or 8, such combination of three 3-bit channel words should not occur.

Another example is the sequence of source words '10 10 11' which by unmodified conversion would yield the three 3-bit channel words '000 000 001'. This combination of three 3-bit channel words does not satisfy a k=6 or k=7 constraint. Moreover, this combination of three 3-bit channel words may follow a previous channel word that ends with a '0', so that it would lead to a violation of a k=8 constraint. Further, the combination ends with a '1', so that it would lead to a violation of the d=1 constraint, if the combination is followed by a 3-bit channel word that starts with a '1'. An equivalent reasoning is valid for the sequence of source words '01 10 10'.

A further example is the sequence of source words '01 10 11' which by unmodified conversion would yield the three 3-bit channel words '100 000 001'. This combination may, in the same way as above, lead to a violation of the d=1 constraint.

The occurrence of such combinations should be detected so that a modified encoding can take place. FIG. 3 shows an embodiment of a device which, in addition to the 'normal' encoding of 2-bit source words into 3-bit channel words, is capable of detecting the above identified combinations, and is capable of realizing a modified encoding.

The device of FIG. 3 includes a shift register 2" having six cells $X_1$ to $X_6$ so as to receive six consecutive bits of the serial bit stream of the source signal S. Outputs of the six cells are coupled to corresponding inputs $i_1$ to $i_6$, respectively, of the logic circuit LC". The device further comprises detector means D2. The detector means D2 are adapted to detect the position in the serial bit stream of the source signal where unmodified encoding of the bit stream would lead to a violation of the k-constraint in the channel signal C, and are adapted to supply a control signal at its output 15 in response to such detection.

The outputs of the six cells are also coupled to four inputs $i_1$ to $i_6$, respectively, of logic circuit LC". The output 15 of the detector means D2 is coupled to a control signal input 16 of the logic circuit LC". The logic circuit LC" has nine outputs $o_1$ to $o_9$, which are coupled to inputs of cells $Y_1$, to $Y_9$, respectively, of second shift register 4".

In the absence of control signals at the control signal inputs 12 and 16, the logic circuit LC' converts a single 2-bit source word '$x_1$ $x_2$' into a single 3-bit channel word '$y_1$ $y_2$ $y_3$' in conformity with the Table I given above. As soon as the detector circuit D1 detects a block of two 2-bit source words '$x_1$ $x_2$, $x_3$ $x_4$' which is equal to one of the combinations given in the above Table II, the logic circuit LC" converts the combination in accordance with the conversion rule as given in the Table II, in order to obtain a block of two 3-bit channel words '$Y_1$ $Y_2$ $Y_3$ $Y_4$ $Y_5$ $Y_6$'.

As soon as the detector D2 detects a block of three 2-bit source words '$x_1$ $x_2$ $x_3$ $x_4$, $x_5$ $x_6$' which is equal to s one of the combinations given above, the logic circuit LC" converts the block in accordance with the modified coding as given in the following Table, in order to obtain a block of three 3-bit channel words:

TABLE III

| source words | unmodified coding | modified coding |
|---|---|---|
| 10 10 10 | 000 000 000 | 000 010 010 |
| 10 10 11 | 000 000 001 | 001 010 010 |
| 01 10 11 | 100 000 001 | 101 010 010 |
| 01 10 10 | 100 000 000 | 100 010 010 |

The logic circuit LC" is adapted to convert, in a modified coding mode, the blocks of three 2-bit source words given in the left column of the above Table III into the blocks of three 3-bit channel words as given in the right column in the above Table. By realizing the modified encoding as in Table III, a channel signal is obtained which satisfies the k=8 constraint. Moreover, the modified encoding is likewise parity preserving or parity inverting in pairs of two source words. This is very useful in order to be able to obtain a DC free precoder output signal by adding one bit to the input signal so as to obtain the bit stream of the source signal to be supplied to the encoding device. This means in the present situation that, if the number of 'ones' in the blocks of three 2-bit source words forming a pair is odd (even), the number of 'ones' in the block of three 3-bit channel words obtained is odd (even), or the inverted situation is obtained, depending on whether the conversion of a pair of the blocks of three 2-bit source words is parity preserving or parity inverting. Furthermore, two of the three 2-bit source words, which are the second one and the third one in the above Table, are encoded into a 3-bit channel word which is unequal to one of the four channel words of Table I. The reason for this is that, at the receiver end, a detection of these two consecutive 3-bit channel words not belonging to the set of four 3-bit channel words of the Table I is possible, so that a corresponding decoding, which is the inverse of the encoding as defined with reference to Table III, can be realized.

The logic circuit LC" supplies the combination of three 3-bit channel words obtained by means of the encoding in conformity with Table III, to its outputs $o_1$ to $o_9$, which channel words are supplied to the nine cells $Y_1$ to $Y_9$ of the shift register 4". The serial data stream of the channel signal C is supplied to the output terminal 8.

It will be evident that, in the same way as described with reference to FIG. 2b, the detection of the violation of the k-constraint can be effected at the channel signal level, instead of at the source signal level.

As stated hereinbefore, other conversion rules for converting single 2-bit source words into single 3-bit channel words are possible. Those conversion rules are given in the following seven Tables.

TABLE IV

| source word $(x_1,x_2)$ | | Channel word $(y_1,y_2,y_3)$ | |
|---|---|---|---|
| $SW_1$ | 00 | $CW_1$ | 101 |
| $SW_2$ | 01 | $CW_2$ | 001 |
| $SW_3$ | 10 | $CW_3$ | 000 |
| $SW_4$ | 11 | $CW_4$ | 100 |

TABLE V

| source word $(x_1,x_2)$ | | Channel word $(y_1,y_2,y_3)$ | |
|---|---|---|---|
| $SW_1$ | 00 | $CW_1$ | 000 |
| $SW_2$ | 01 | $CW_2$ | 100 |
| $SW_3$ | 10 | $CW_3$ | 101 |
| $SW_4$ | 11 | $CW_4$ | 001 |

TABLE VI

| source word $(x_1,x_2)$ | | Channel word $(y_1,y_2,y_3)$ | |
|---|---|---|---|
| $SW_1$ | 00 | $CW_1$ | 000 |
| $SW_2$ | 01 | $CW_2$ | 001 |
| $SW_3$ | 10 | $CW_3$ | 101 |
| $SW_4$ | 11 | $CW_4$ | 100 |

TABLE VII

| source word $(x_1,x_2)$ | | Channel word $(y_1,y_2,y_3)$ | |
|---|---|---|---|
| $SW_1$ | 00 | $CW_1$ | 100 |
| $SW_2$ | 01 | $CW_2$ | 101 |
| $SW_3$ | 10 | $CW_3$ | 001 |
| $SW_4$ | 11 | $CW_4$ | 000 |

TABLE VIII

| source word $(x_1,x_2)$ | | Channel Word $(y_1,y_2,y_3)$ | |
|---|---|---|---|
| $SW_1$ | 00 | $CW_1$ | 001 |
| $SW_2$ | 01 | $CW_2$ | 101 |
| $SW_3$ | 10 | $CW_3$ | 100 |
| $SW_4$ | 11 | $CW_4$ | 000 |

TABLE IX

| source word $(x_1,x_2)$ | | Channel word $(y_1,y_2,y_3)$ | |
|---|---|---|---|
| $SW_1$ | 00 | $CW_1$ | 100 |
| $SW_2$ | 01 | $CW_2$ | 000 |
| $SW_3$ | 10 | $CW_3$ | 001 |
| $SW_4$ | 11 | $CW_4$ | 101 |

TABLE X

| source word $(x_1,x_2)$ | | Channel word $(y_1,y_2,y_3)$ | |
|---|---|---|---|
| $SW_1$ | 00 | $CW_1$ | 001 |
| $SW_2$ | 01 | $CW_2$ | 000 |
| $SW_3$ | 10 | $CW_3$ | 100 |
| $SW_4$ | 11 | $CW_4$ | 101 |

It is evident that extensions of those conversion rules for encoding blocks of two or three 2-bit source words into blocks of two or three 3-bit channel words can be obtained using the teachings given above.

A further embodiment of an encoder is explained with reference to the following Table XI. This Table shows the conversion rule for an encoder capable of encoding 3-bit source words into 4-bit channel words.

TABLE XI

| source word ($x_1,x_2,x_3$) | | Channel word ($y_1,y_2,y_3,y_4$) | |
|---|---|---|---|
| $SW_1$ | 000 | $CW_1$ | 0000 |
| $SW_2$ | 001 | $CW_2$ | 0001 |
| $SW_3$ | 010 | $CW_3$ | 0100 |
| $SW_4$ | 011 | $CW_4$ | 0101 |
| $SW_5$ | 100 | $CW_5$ | 1001 |
| $SW_6$ | 101 | $CW_6$ | 1000 |
| $SW_7$ | 110 | $CW_7$ | 0010 |
| $SW_8$ | 111 | $CW_8$ | 1010 |

In Table XI the conversion of the source word belonging to the pairs of source words ($SW_1$, $SW_2$) and ($SW_3$, $SW_4$) is parity preserving and the conversion of the source word belonging to the pairs of source words ($SW_5$, $SW_6$) and ($SW_7$, $SW_8$) is parity inverting. In this case the value of a pair of source words differs only in the value of the bit $X_3$. However, the same Table can be used to form pairs of source words in which only the value of the bit $x_2$ differs. For example, pairs of source words may be formed by ($SW_1$, $SW_3$), ($SW_2$, $SW_4$), ($SW_5$, $SW_7$) and ($SW_6$, $SW_8$), in which the conversion of the first two pairs and the last two pairs is, respectively, parity preserving and parity inverting. It should be noted that it is not necessary that in a conversion Table in accordance to the invention the number of parity preserving pairs of source words is equal to the number parity inverting pairs of source words. Thus, the 3-bit source word conversion into 4-bit channel word may comprise three pairs of source words that are parity preserving and one pair of source words that is parity inverting.

As stated hereinbefore, the devices described above are very suitable in combination with a converter unit in which one bit is inserted after each r bits in a serial data stream in order to realize or not to realize a polarity conversion. FIG. 4 shows such combination, where the converter unit 40 is followed by the device 7' in accordance with the present invention 41, which device 7' is subsequently followed by a 1T-precoder 42, well known in the art. The output signal of the 1T-precoder 42 is applied to a control signal generator 43, which generates the control signal for the converter unit 40, so as to control whether a '0' or a '1' is inserted in the serial data stream applied to the device 7'. Inserting a '0' or a '1' bit always leads to, respectively, an increase and decrease, or a decrease and increase in the running digital sum value at the output of the precoder 42. By means of the arrangement shown in FIG. 4 it is possible to embed a tracking tone of a certain frequency in the serial data stream, or to maintain the DC content of the data stream at zero. Furthermore, when the device 7' is adapted to generate a (d,k) sequence as explained above, it causes the output signal of the arrangement of FIG. 4 to be a (d,k) RLL output signal. Examples of the converter 40 are given in Bell System Technical Journal, Vol 53, No. 6, pp. 1103–1106.

FIG. 5 shows a decoding device for decoding the serial data stream obtained by the encoding device of FIG. 3 in order to obtain a binary source signal. The decoding device has an input terminal 50 for receiving the channel signal, which input terminal 50 is coupled to an input 56 of a shift register 51, comprising nine cells $Y_1$, to $Y_9$. The shift register 51 functions as a serial-parallel converter so that blocks of three 3-bit channel words are applied to inputs $i_1$ to $i_9$ of a logic circuit 52. The logic circuit 52 comprises the three Tables I, II and III. Outputs $o_1$ to $o_6$ of the logic circuit 52 are coupled to inputs of cells $X_1$ to $X_6$ of a shift register 54, which has an output 57 coupled to an output terminal 55. A detector circuit 53 has inputs $i_1$ to $i_6$ coupled to outputs of cells $Y_4$ to $Y_9$, respectively, of the shift register 51, and has outputs $o_1$ and $o_2$ coupled to control inputs $c_1$ and $c_2$, respectively, of the logic circuit 52. The detector circuit 53 is capable of detecting a '010' bit pattern in the cells $Y_4$, $Y_5$ and $Y_6$ of the shift register 51 and is capable of detecting a bit pattern '010010' in the cells $Y_4$ to $Y_9$ of the shift register 51.

Upon detection of the '010010' bit pattern, the detector circuit 53 generates a control signal at its output $o_2$, and upon detection of a '010' bit pattern in the cells $Y_4$, $Y_5$ and $Y_6$, while there is no '010' bit pattern in the cells $Y_7$, $Y_8$ and $Y_9$, it generates a control signal at its output $o_1$.

In the absence of the control signals, the logic circuit 52 converts the 3-bit channel word stored in the cells $Y_1$, $Y_2$ and $Y_3$ into its corresponding 2-bit source word, in accordance with the conversion Table I, and supplies the 2-bit source word to the cells $X_1$ and $X_2$. When the control signal is present at the input $c_1$, the logic circuit 52 converts the block of two 3-bit channel words stored in the cells $Y_1$, to $Y_6$ into a block of two 2-bit source words, in accordance with the conversion Table II, and supplies the two 2-bit source words to the cells $X_1$ to $X_4$. When the control signal is present at the input $c_2$, the logic circuit 52 converts the block of three 3-bit channel words stored in the cells $Y_1$, to $Y_9$ into a block of three 2-bit source words, in accordance with the conversion Table III, and supplies the three 2-bit source words to the cells $X_1$ to $X_6$. In this way, the serial data stream of the channel signal is converted into the serial data stream of the source signal.

The encoded information supplied to the input 50 may have been obtained by reproduction of information from a record carrier, such as a magnetic record carrier 23 or an optical record carrier 23'. For this purpose, the device of FIG. 5 comprises a read unit 62 for reading the information from a track on the record carrier, which the unit 62 comprises a read head 64 for reading the information from said track.

Though the invention is described with reference to preferred embodiments thereof, it is to be understood that these are non-limitative examples. Thus, various modifications are conceivable to those skilled in the art, without departing from the scope of the invention, as defined by the claims. As an example, the decoding device of FIG. 5 may be modified into a device in which the detector 53 detects the various modified decoding situations from the decoded information, instead of from the encoded information, as disclosed in FIG. 5. Furthermore, it is to be noted that, as an example, the converter unit 7' and the precoder 42 may be combined to are unit, where, depending on incoming n-bit source words, these n-bit source words are directly converted via a conversion Table into 3-bit output words of the combined unit. Furthermore, the invention is also suitable to be used in an 8-bit-source-word to 15-bit-channel-word converter.

The use of the verb "to comprise" and its conjugations does not exclude the presence of elements or steps other than those stated in a claim. Furthermore, the use of the article "a" or "an" preceding an element does not exclude the presence of a plurality of such elements. In the claims, any reference signs placed between parentheses shall not be construed as limiting scope of the claims. The invention may be implemented by means of hardware as well as software. Several "means" may be represented by the same item of hardware. Furthermore, the invention resides in each and every novel feature or combination of features.

What is claimed is:

1. A device for encoding a stream of data bits of a binary source into a stream of data bits of a binary channel signal, wherein the bit stream of the source signal is divided into n-bit source words, which device comprises converting means for converting said source words into corresponding m-bit channel words, characterized in that each value of the n-bit source words together with another value of the n-bit source words forms a pair of source words, said device further comprises bit addition means for adding a $q^{th}$ bit at a $q^{th}$ bit position of each n-bit source word such that the values of the source words of said pair of n-bit source words differ only in the bit values of the bits in the $q^{th}$ bit position of the n-bit source words, q being a constant, the pairs of n-bit source words being subdivided into a first part and a remaining part, and the converting means are adapted to convert n-bit source words into m-bit channel words, in such a manner that the conversion of the two source words forming a pair of source words of the first part of the pairs of n-bit source words is parity preserving and the conversion of the two source words forming a pair of source words of the remaining part of the pairs of n-bit source words is parity inverting, wherein the binary channel signal corresponds to information encoded by a record carrier on a track thereof and readable from the track by a reading unit of a decoding device, and said device further comprises an input for interfacing with an output of said decoding device for receiving the binary channel signal from the decoding device, wherein said device only receives and propagates digital signals therein.

2. A device as claimed in claim 1, characterized in that the converting means are adapted to convert a block of p consecutive n-bit source words into a corresponding block of p consecutive m-bit channel words, where n, m and p are integers, $m>n \geq 2$, $p \geq 1$, and where p can vary.

3. A device as claimed in claim 2, characterized in that $m=n+1$.

4. A device as claimed in claim 3, characterized in that $n=2$.

5. A device as claimed in claim 4, characterized in that the device is adapted to convert single source words into corresponding single channel words in accordance with the following Table:

| source word | | Channel word | |
|---|---|---|---|
| $SW_1$ | 00 | CW1 | 101 |
| $SW_2$ | 01 | $CW_2$ | 100 |
| $SW_3$ | 10 | $CW_3$ | 000 |
| $SW_4$ | 11 | $CW_4$ | 001 |

6. A device as claimed in claim 4 or 5, wherein the converting means are adapted to convert 2-bit source words into corresponding 3-bit channel words, so as to obtain a channel signal in the form of a (d,k) sequence, where d=1, the device further comprising means for detecting the position in the bit stream of the source signal where encoding of single 2-bit source words into corresponding single channel words would lead to a violation of the d-constraint at the channel word boundaries and for supplying a control signal in response to said detection, characterized in that, in the absence of the control signal, the converting means are adapted to convert single 2-bit source words into corresponding single 3-bit channel words.

7. A device as claimed in claim 6, wherein, in the presence of the control signal, which occurs during the conversion of two consecutive source words, the converting means are adapted to convert a block of said two consecutive 2-bit source words into a block of two corresponding 3-bit channel words, in such a manner that one of the two source words in the block of source words is converted into a 3-bit channel word which is not identical to one of the four channel words $CW_1$ to $CW_4$, in order to preserve the d=1 constraint, characterized in that, in the presence of said control signal, the converting means are further adapted to convert the block of said two subsequent 2-bit source words into a corresponding block of two subsequent 3-bit channel words.

8. Device as claimed in claim 1 or 7, characterized in that the converting means are adapted to convert blocks of two consecutive 2-bit source words into blocks of two consecutive 3-bit channel words in accordance with the coding given in the following Table:

| block of 2 source words | Block of 2 channel words |
|---|---|
| 00 00 | 100 010 |
| 00 01 | 101 010 |
| 11 00 | 000 010 |
| 11 01 | 001 010 |

9. A device as claimed in claim 6, where k has a value larger than 5, the device further having means for detecting the position in the bit stream of the source signal where encoding of single 2-bit source words into single 3-bit channel words would lead to a violation of the k-constraint and for supplying a second control signal in response to said detection, characterized in that, in the presence of the second control signal, which occurs during the conversion of three consecutive 2-bit source words, the converting means are adapted to convert a block of said three consecutive 2-bit source words into a block of corresponding three consecutive 3-bit channel words, the converting means are further adapted to convert two of the three source words in the block into corresponding 3-bit channel words not identical to the four channel words $CW_1$ to $CW_4$, in order to preserve the k constraint.

10. A device as claimed in claim 1 or 9, characterized in that the converting means are adapted to convert blocks of three consecutive 2-bit source words into blocks of three consecutive 3-bit channel words in accordance with the coding given in the following Table:

| block of 3 source words | block of 3 channel words |
|---|---|
| 10 10 10 | 000 010 010 |
| 10 10 11 | 001 010 010 |
| 01 10 11 | 101 010 010 |
| 01 10 10 | 100 010 010 |

11. A device as claimed in claim 1, characterized in that the conversion means are adapted to perform a signal processing operation upon the binary source signal, which operation is equivalent to the conversion of consecutive source words into consecutive channel words, followed by 1T precoding of said channel words.

12. A device as claimed in claim 1 or 11, characterized in that it further comprises bit-adding means for adding one bit to subsequent blocks of r bits of the source signal.

13. A device as claimed in claim 1, characterized in that it further comprises means for recording the stream of data bits of the binary channel signal in a track on the record carrier.

14. A method for encoding a stream of data bits of a binary source signal into a stream of data bits of a binary channel signal, wherein the bit stream of the source signal is divided into n-bit source words, the method comprising the steps of:

converting said n-bit source words into corresponding m-bit channel words, characterized in that each value of the n-bit source words together with another value of the n-bit source words forms a pair of source words; and adding a $q^{th}$ bit at a $q^{th}$ bit position of each n-bit source word such that the values of the source words of said pair of n-bit source words differ only in the bit values of the bits in the $q^{th}$ bit position of the n-bit source words, q being a constant, the pairs of n-bit source words being subdivided into a first part and a remaining part, and the converting step comprises conversion of n-bit source words into m-bit channel words, in such a manner that the conversion of the two source words forming a pair of source words of the first part of the pairs of n-bit source words is parity preserving and the conversion of the two source words forming a pair of source words of the remaining part of the pairs of n-bit source words is parity inverting, wherein said steps are performed by a device comprising an input for interfacing with an output of a decoding device for receiving the binary channel signal from the decoding device, wherein said device only receives and propagates digital signals therein, and wherein the binary channel signal corresponds to information encoded by a record carrier on a track thereof and readable from the track by a reading unit of the decoding device.

15. A device comprising an input for receiving encoded information obtained by reproduction of information encoded by a record carrier by a decoding device, said record carrier provided with a binary channel signal, which binary channel signal has been obtained by conversion of a corresponding binary source signal, wherein the bit stream of the binary channel signal has been divided into m-bit channel words, the binary source signal has been divided into n-bit source words and the m-bit channel words have been obtained by conversion of the n-bit source words into corresponding m-bit channel words, wherein each value of the n-bit source words together with another value of the n-bit source words forms a pair of source words, the addition of a $q^{th}$ bit at a $q^{th}$ bit position of each n-bit source word such that the values of the source words of said pair of n-bit source words differ only in the bit values of the bits in the $q^{th}$ bit position of the n-bit source words, q being a constant, the pairs of n-bit source words being subdivided into a first part and a remaining part, the conversion of the n-bit source words into m-bit channel words being such that the conversion of the two source words forming a pair of source words of the first part of the pairs of n-bit source words is parity preserving and the conversion of the two source words forming a pair of source words of the remaining part of the pairs of n-bit source words is parity inverting, wherein at least one track of the record carrier is readable by a reading unit of the decoding device, and wherein said device only receives and propagates digital signals therein.

16. A device comprising an input for receiving encoded information obtained by reproduction of information encoded by a record carrier by a decoding device, said record carrier provided with a 1T-precoded channel signal, which 1T precoded channel signal has been obtained by conversion of a corresponding binary source signal, wherein the bit stream of the binary channel signal has been divided into m-bit channel words, the binary source signal has been divided into n-bit source words and the m-bit channel words have been obtained by conversion of the n-bit source words into corresponding m-bit channel words, wherein each value of the n-bit source words together with another value of the n-bit source words forms a pair of source words, the addition of a $q^{th}$ bit at a $q^{th}$ bit position of each n-bit source word such that the values of the source words of said pair of n-bit source words differ only in the bit values of the bits in the $q^{th}$ bit position of the n-bit source words, q being a constant, the pairs of n-bit source words being subdivided into a first part and a remaining part, the conversion of the n-bit source words into m-bit channel words being such that the conversion of the two source words forming a pair of source words of the first part of the pairs of n-bit source words is parity preserving and the conversion of the two source words forming a pair of source words of the remaining part of the pairs of n-bit source words is parity inverting, wherein at least one track of the record carrier is readable by a reading unit of the decoding device, and wherein said device only receives and propagates digital signals therein.

17. A device for decoding a stream of data bits of a binary channel signal into a stream of data bits of a binary source signal, wherein the bit stream of the channel signal is divided into m-bit channel words, which device comprises reading means for reading a record carrier encoding information corresponding to the stream of data bits of the binary channel signal; deconverting means for deconverting m-bit channel words into corresponding n-bit source words, characterized in that each value of the n-bit source words together with another value of the n-bit source words forms a pair of source words and a $q^{th}$ bit is added at a $q^{th}$ bit position of each n-bit source word such that the values of the source words of said pair of n-bit source words differ only in the bit values of bit in the $q^{th}$ bit position of then-bit source words, q being a constant, the pairs of n-bit source words being subdivided into a first part and a remaining part, and the decoverting means are adapted to deconvert m-bit channel words into n-bit source words, in such a manner that the deconversion of the m-bit channel words into the source words that form a pair of source words of the first part of the pairs of n-bit source words is parity preserving and the conversion of the m-bit channel words into the source words that form a pair of source words of the remaining part of the pairs of n-bit source words is parity inverting, and said device further comprises an input for interfacing with an output of a decoding device for receiving the binary channel signal from the decoding device, wherein said device only receives and propagates digital signals therein.

18. A decoding device as claimed in claim 17, characterized in that the deconverting means are adapted to deconvert a block of p consecutive m-bit channel words into a corresponding block of p consecutive n-bit source words, where n, m and p are integers, m>n≧2, p≧1, and where p can vary.

19. A decoding device as claimed in claim 17 or 18, characterized in that the deconverting means are adapted to deconvert m-bit channel words into n-bit source words in accordance with at least one of the Tables shown in the description.

* * * * *